United States Patent [19]
Lighty

[11] 4,428,646
[45] Jan. 31, 1984

[54] OPTICAL FIBERS HAVING CRYSTALLINE MATERIAL AND METHOD OF MAKING SAME

[75] Inventor: Paul E. Lighty, Lafayette, N.J.

[73] Assignee: International Standard Electric Corporation, New York, N.Y.

[21] Appl. No.: 310,348

[22] Filed: Oct. 13, 1981

[30] Foreign Application Priority Data

Feb. 11, 1981 [GB] United Kingdom ............... 8104271

[51] Int. Cl.³ ................ G02B 5/172; C03B 37/025; C03C 3/30
[52] U.S. Cl. ............................ 350/96.31; 65/3.11; 350/96.34; 501/37; 501/40
[58] Field of Search .............. 65/3.11; 501/37, 40; 350/96.31, 96.34

[56] References Cited

U.S. PATENT DOCUMENTS

| | | | |
|---|---|---|---|
| 3,227,032 | 1/1966 | Upton | 65/3.11 X |
| 4,189,208 | 2/1980 | Grodkiewicz et al. | 65/3.11 X |
| 4,315,667 | 2/1982 | Nakagome et al. | 350/96.34 |

FOREIGN PATENT DOCUMENTS

| | | | |
|---|---|---|---|
| 56-100147 | 8/1981 | Japan | 65/3.11 |
| 2020057 | 11/1979 | United Kingdom | |

*Primary Examiner*—Richard V. Fisher
*Attorney, Agent, or Firm*—John T. O'Halloran; Mary C. Werner

[57] ABSTRACT

An optical fiber with a graded index crystalline core (2,3) is made by filling a tube (1) with a mixture of two salts for which the one with the higher melting point has the lower refractive index. A graded composition results from partition effects when the fused salts are slowly cooled so that solidification proceeds uniformly inwardly from the tube wall. Fiber is pulled conventionally from the reesulting preform, and later is passed through a short hot zone to convert the core into single crystal form.

12 Claims, 1 Drawing Figure

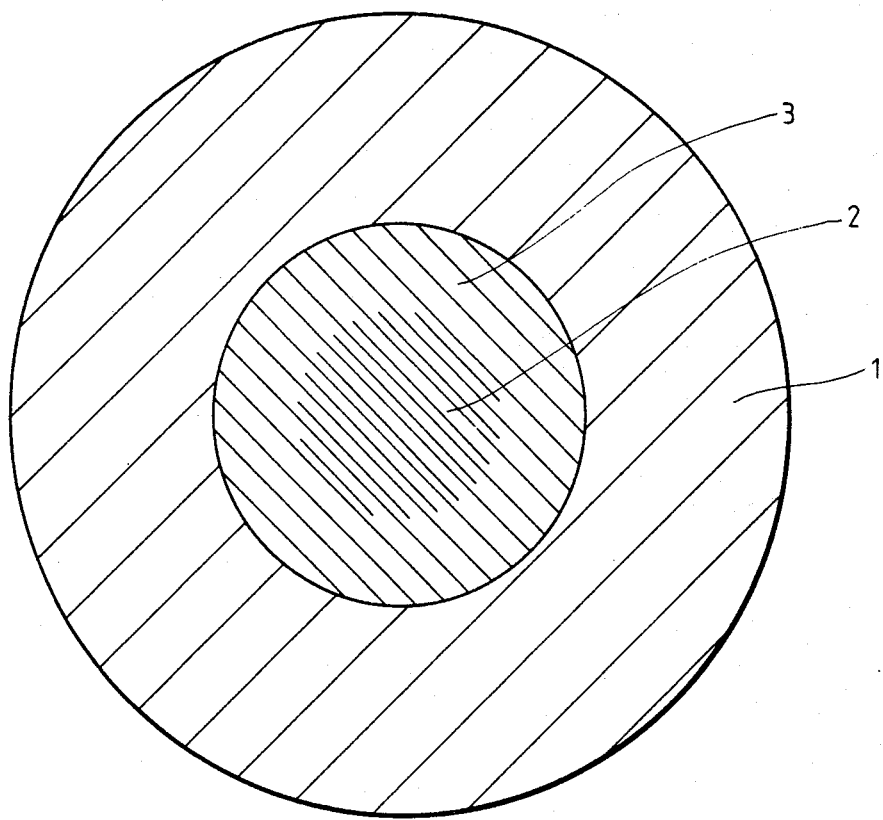

OPTICAL FIBERS HAVING CRYSTALLINE MATERIAL AND METHOD OF MAKING SAME

FIELD OF THE INVENTION

The invention relates to optical fibers.

For telecommunications applications there has been great interest in fibers designed to operate at wavelengths in the region of 1 to 1.8 microns where both the attenuation and dispersion of silica-based waveguides are a minimum.

Since Rayleigh scatter increases as the fourth power of wavelength there exists the possibility of even lower intrinsic attenuations at longer wavelengths. The main electronic absorption edge has an associated exponentially decaying weak tail, and the total loss therefore falls with increasing wavelength to a cross-over point where the tail of the phonon-edge becomes the dominant absorption mechanism. In the case of silica based materials this cross-over point occurs at around 2 microns, and hence in order to realize the potential of very low losses it is necessary to look to alternative materials where phonon-edges are located deeper into the infra-red than that of silica.

In British Patent Specification No. 2020057A, published Nov. 7, 1979, there is proposed an optical waveguide structure having a crystalline core encased in silica tubular cladding in order to take advantage of the spectral window possessed by certain crystals that extends deep into the infra-red. It was proposed that the crystalline material should function as the optical core, and that the silica tube should function as the optical cladding, and should for this purpose therefore have a slightly lower refractive index than that of the crystalline material.

An inherent problem associated with structures of the type set out in that specification results from the nature of the interference between the crystalline core and the glassy cladding. Facets on the crystal surface at this interface will produce perturbations, which, since they are located where the optical field is significant, are liable to result in excessive scattering loss for propagating light.

The present invention discloses an improved structure in which scattering at the interface between the crystalline and glassy materials has less effect upon optical transmission because this interface is arranged to occur at a region where the optical field is much reduced in magnitude.

SUMMARY OF THE INVENTION

According to the present invention there is provided an optical fiber or optical fiber preform consisting of a glassy tube filled with a mixture of two or more crystalline materials existing in solid solution, which mixture possesses an optical waveguiding radial grading of composition and refractive index, and melts at a temperature at which the glassy tube still has sufficiently good mechanical properties to be capable of acting as a container for the molten mixture.

The invention also provides a method of making an optical fibre preform having a glassy tube filled with a mixture of two or more crystalline materials existing in solid solution, which mixture possesses an optical waveguiding radial grading of composition and refractive index, and melts at a temperature at which the glassy tube still has sufficiently good mechanical properties to be capable of acting as a container for the molten mixture, wherein said graded mixture is made by lining the bore of the glassy tube with a first material, filling the lined tube with a second material, and then heating the resulting structure to cause said first material to diffuse into said second material.

Alternatively the guided mixture is made by forming a mixture of two or more materials, fusing them together within the bore of the tube, and then cooling the tube to solidify its contents from the outside in while maintaining substantially no temperature gradient in the tube contents in the axial direction and while the tube is rotated about its axis held horizontal.

BRIEF DESCRIPTION OF THE DRAWING

The accompanying drawing depicts a cross-section through a fiber or fiber preform made according to the invention. The following is a description of examples of waveguide structures embodying the invention in its preferred forms.

DETAILED DESCRIPTION OF THE INVENTION

Referring to the accompanying drawing, an optical fiber or optical fiber preform according to the present invention consists of a glass tube 1 surrounding a crystalline rod whose composition is radially graded to provide its central region 2 with a higher refractive index than that of its peripheral region 3. This grading may be provided by lining the bore of the tube with an index-reducing dopant which is subsequently diffused into the crystalline material. An alternative method of providing the requisite grading makes use of the partition effects when a crystal mixture is subjected to controlled cooling. For this purpose a pair of structurally compatible crystals with similar physical properties are required which will form solid solutions, and in which the one having the higher melting point, the solvent, also has the lower refractive index. Controlled cooling of a long cylinder of the liquid mixture under conditions providing cylindrical symmetry of the temperature distribution will cause the material to solidify from the outside in. At an interface between solid and liquid there is, under equilibrium conditions, a greater concentration of solute in the liquid than in the solid. Hence controlled cooling results in a solid cylinder with a radial grading of composition in which the solute concentration decreases with distance from the axis. This principle can of course be extended to producing a graded index distribution using the partition effects occuring with a mixture of three or more components.

Examples of possible pairs of components for producing index grading are:

| Salt | Melting Point (°C.) | Refractive Index |
| --- | --- | --- |
| LiF | 870 | 1.35 |
| NaF | 999 | 1.31 |
| $BaF_2$ | 1280 | 1.45 |
| $CaF_2$ | 1360 | 1.41 |
| NaCl | 730 | 1.52 |
| KCl | 776 | 1.49 |
| CaBr | 636 | 1.67 |
| KBr | 730 | 1.53 |

A glass tube is filled with the required crystal mixture and is then mounted with its axis horizontal in a suitable furnace where it is heated to fuse the tube contents. Clearly this requires that the tube shall not be too appreciably softened at the melting point of its contents. The tube and its contents are then slowly cooled whilst being continuously rotated about the tube axis and whilst a uniform temperature is maintained in the furnace from end to end of the tube. Crystallization commences at the inner wall of the tube and proceeds inwards until all the material has solidified. With the appropriate crystal mixture the cooling results in a radial grading of refractive index in which the index reduces with increasing distance from the tube axis thus producing an optical waveguiding structure, an optical fiber preform. Considerable control of the shape of the index profile in this preform is possible through selection of the component of the crystal mixture and by repeating the cycle of melting and recrystallization. Under some circumstances there is the possibility that this crystallization will form a void at the center, this being due to volume changes taking place upon solidification. If this occurs it does not necessarily make that particular composition unworkable because the void can, in suitable circumstances, become filled during a later processing step.

Once the requisite index profile has been produced in the preform it is mounted in fiber drawing apparatus which may be of conventional design used for pulling optical fibers from all-glass preforms. Provided that the softening point of the glass tube is not very much higher than the melting point of its contents the drawing operation can be performed at a sufficiently high temperature to enable fiber to be drawn at speeds comparable with those used for drawing from all-glass preforms. Upon leaving the drawing zone the tube and its contents cool with the result that the tube contents recrystallizes in polycrystalline form with a radially graded distribution of refractive index.

The resulting fiber may then be indefinitely stored for instance on a drum until required for conversion into single crystal form. This conversion is effected by passing the fiber through a short hot zone in which the crystalline material is briefly fused. It will be appreciated that the recrystallization is in tubing with a very small diameter bore and hence single crystal growth occurs by virtue of the same mechanism used in the well-known Bridgman method of preparing single crystal material.

The speed at which the fiber should be passed through the hot zone will depend upon a number of factors including the nature of the material being recrystallized, the length of the hot zone, and its temperature profile. The rate of recrystallization must not be so fast as to encourage new nucleation sites, yet it must be fast enough to limit the extent of the diffusion taking place in the molten phase which tends to homogenize the previously carefully procured graded composition. Furthermore a fast throughput is desirable to minimize fiber processing time. Fortunately the very fineness of the diameter of the crystalline material militates towards a relatively fast throughput compared with the growth of larger diameter single crystal material, and wall effects will tend to reduce the extent of the unwelcome diffusion effects.

Lengthwise transfer of solute will occur during this final recrystallization stage to produce single crystal material as a result of the previously referred to partitioning effects, however these will reach a steady state after the fiber has passed through a few melt zone lengths. In the context of lengthwise transfer of material it is to be noted that this recrystallization may also result in the formation of a void due to volume change upon recrystallization, but in this instance the recrystallization, is proceeding longitudinally rather than radially, and hence any void will propagate with the molten zone. Moreover it is possible for this recrystallization to fill any axial void left by a previous radial crystallization process.

To demonstrate the feasibility of optical fiber manufacture by this method a mixture of chlorides of potassium and sodium was placed in a borosilicate tube having a wall thickness of about 1 mm and a bore diameter of about 10 mm. This was converted to an optical fiber preform by heating it up to 800° C. in a horizontal muffle furnace. Then, while the tube was rotated about its axis at 10 r.p.m., the furnace temperature was slowly decreased at a rate of between 2° and 3° C. per minute in order to allow recrystallization to proceed uniformly inwardly from inner wall of the tube. The resulting preform was then mounted in a pulling tower and a length of fiber drawn from its tip using an oxyhydrogen burner. Photomicrographic examination of the fiber revealed that, even without recrystallization in the fiber state, the material inside the glass was single crystal over very short lengths of the order of 2 cm, and that no central void had been formed. There was however some evidence of fracture in the crystalline material, but this has been attributed to the fact that the borosilicate of the glass tube, having an expansion coefficient of about $3.3 \times 10^{-6}/°C.$, is far from well matched with the crystalline core which has an expansion coefficient of the order 20 to $50 \times 10^{-6}/°C$. It is therefore expected that this problem can be readily overcome by using a glass with larger expansion coefficient. It is believed possible to provide conditions under which a close match will not prove necessary.

Throughout this specification reference has been made to the provision of a graded index structure. Since this grading is provided at least in the first instance in order to reduce the optical field strength at the interface between the crystalline and glassy materials it should be clearly apparent that the grading is not restricted solely to such gradings as will provide a near parabolic distribution of refractive index but will comprehend a wide range of different waveguiding profiles within the crystalline material.

I claim:

1. An optical fiber preform comprising:
a core having a radial gradient of composition and a refractive index that increases radially inwardly including an outer section of a first two-element compound crystalline material having a predetermined melting point, an inner section of a second two-element crystalline material having a higher refractive index and a lower melting point than said first crystalline material, and a partition layer formed at the interface between the outer and inner sections and including the first crystalline material in a radially inwardly diminishing amount and the second crystalline material in a radially inwardly increasing amount; and
a cladding layer surrounding said core and having a melting point higher than said first crystalline material.

2. An optical fiber preform as claimed in claim 1 wherein said first crystalline material is sodium fluoride and said second crystalline material is lithium fluoride.

3. An optical fiber preform as claimed in claim 1 wherein said first crystalline material is calcium fluoride and said second crystalline material is barium fluoride.

4. An optical fiber preform as claimed in claim 1 wherein said first crystalline material is potassium chloride and said second crystalline material is sodium chloride.

5. An optical fiber preform as claimed in claim 1 wherein said first crystalline material ls potassium bromide and said second crystalline material is calcium bromide.

6. An optical fiber drawn from the preform claimed in claim 1.

7. An optical fiber as claimed in claim 6 wherein the core is in the form of a single crystal.

8. An optical fiber preform comprising:
a core having a radial grading of composition and a radially inwardly increasing refractive index and being formed from a mixture of a first two-element compound crystalline material with a predetermined melting point and a second two-element compound crystalline material with a lower melting point and a higher refractive index than the first crystalline material so that when the two materials are heated and then cooled in incremental steps while the tube is horizontally positioned and rotated, the first material begins to solidify before the second material thereby forming the outer portion of the core and the second material solidifies after the first material thereby forming the inner portion of the core, to cause a partition layer to be formed at the interface between the outer and inner sections of the core; and
a cladding layer surrounding the core and having a melting point higher than the first crystalline material.

9. A method of making an optical fiber preform comprising the steps of:
lining the interior surface of a glassy tube which forms a cladding with a dopant material having a melting temperature below that of the tube;
filling the lined tube with a crystalline material having a higher refractive index than the dopant material and a melting temperature below that of the tube;
heating the tube to a temperature below the melting temperature of the tube so that the tube has sufficiently good mechanical properties to be capable of acting as a container for the heated mixture and to a temperature sufficient to cause the dopant material to diffuse into the crystalline material in order to produce a solid solution core possessing an optical waveguiding radial gradient of composition and a refractive index that increases radially inwardly.

10. A method of making an optical fiber preform having a glassy tube filled with a mixture of at least two crystalline materials existing in solid solution, which mixture possesses an optical waveguiding radial grading of composition and refractive index, and melts at a temperature at which the glassy tube still has sufficiently good mechanical properties to be capable of acting as a container for the molten mixture, wherein said graded mixture is made by forming a mixture of at least two materials, fusing them together within the bore of the tube, and then cooling the tube to solidify its contents from the outside in whilst maintaining substantially no temperature gradient in the tube contents in the axial direction and while the tube is rotated about its axis held horizontal.

11. A method of making an optical fiber wherein the preform is made by the method claimed in claim 10 and said preform is drawn into fiber.

12. A method of making an optical fiber whose crystalline material is in the form of a single crystal wherein an optical fiber is made by the method claimed in claim 11 and said fiber is passed longitudinally at a controlled rate through a hot zone within which the mixture of crystalline materials is fused and recrystallized sufficiently rapidly to retain a measure of radial grading in the recrystallized material.

* * * * *